United States Patent [19]

Tung

[11] Patent Number: 4,814,835
[45] Date of Patent: Mar. 21, 1989

[54] ACTIVE LOAD TYPE OF CURRENT SOURCE AND METHOD OF MAKING IT

[75] Inventor: Pham N. Tung, Paris, France
[73] Assignee: Thomson-CSF, Paris, France
[21] Appl. No.: 81,723
[22] Filed: Aug. 5, 1987
[30] Foreign Application Priority Data Aug. 8, 1986 [FR] France .............................. 86 11836

[51] Int. Cl.⁴ ...................... H01L 27/04; H01L 29/80
[52] U.S. Cl. .................................. 357/22; 357/23.12; 357/51
[58] Field of Search ................. 357/22 C, 22 T, 22 K, 357/23.12, 51

[56] References Cited

U.S. PATENT DOCUMENTS

| 4,255,674 | 3/1981 | Grenier et al. | 357/51 |
| 4,402,127 | 9/1983 | Pham et al. | 357/3 |
| 4,485,390 | 11/1984 | Jones et al. | 357/23.12 |
| 4,628,338 | 12/1986 | Nakayama | 357/22 I |
| 4,709,251 | 11/1987 | Suzuki | 357/55 |

FOREIGN PATENT DOCUMENTS 0152615  8/1985  European Pat. Off. .
0176754  9/1986  European Pat. Off. .

OTHER PUBLICATIONS

Proceedings of the IEEE, vol. 70, No. 1, Jan. 1982, pp. 35–45, IEEE, New York, U.S.; S. I. Long et al.: "High Speed GaAs Integrated Circuits".

Primary Examiner—William D. Larkins
Attorney, Agent, or Firm—Oblon, Fisher, Spivak, McClelland & Maier

[57] ABSTRACT

An active load in an integrated logic circuit of the Direct Coupled FET Logic (DCFL type) in which the active load has a negative threshold voltage and the transistors have a positive threshold voltage. The active load is a transistor, the gate metallization of which is combined with the source metallization. If the active load delivers an excessive current, this current can be adjusted by adding at least one second gate which has a positive threshold voltage and which is in electrical contact with the first gate with a negative threshold voltage. The appropriate threshold voltages are obtained by bombarding the corresponding gate regions. The transistors of the integrated circuit are obtained during the manufacture of the second gate.

3 Claims, 1 Drawing Sheet

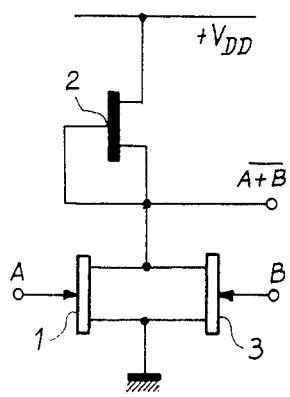
FIG_1
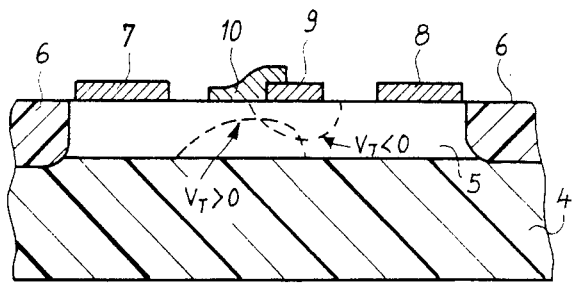
FIG_2
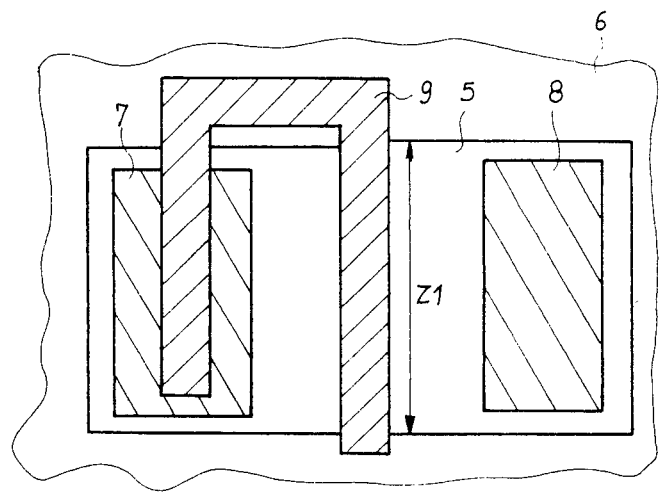
FIG_3
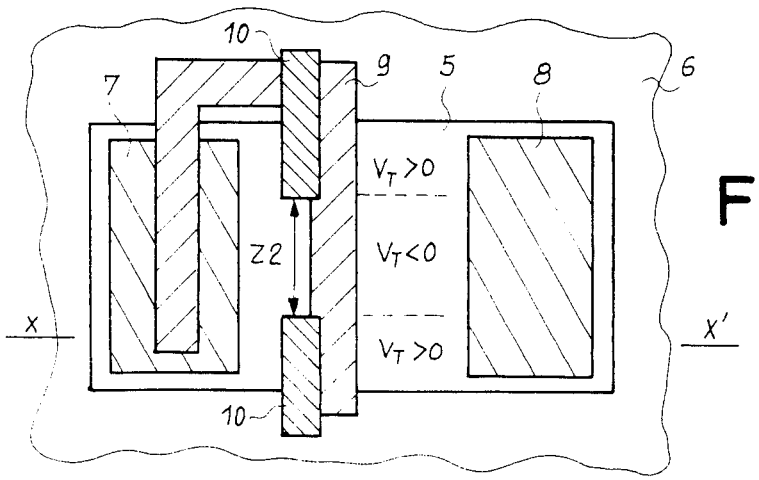
FIG_4

ACTIVE LOAD TYPE OF CURRENT SOURCE AND METHOD OF MAKING IT

BACKGROUND OF THE INVENTION

1. Field of the Invention

The present invention pertains to an active load, a current source for high-speed logic circuits working with normally-off transistors. The structure of this active load enables it to be a current source that has a well-defined current, regardless of variations in the manufacture of the wafers in which the said logic circuits are made, these wafers being generally made of high-speed materials of the III–V group such as GaAs. The invention also pertains to a method for manufacturing this active load.

2. Description of the Prior Art

The development of high-speed logic circuits is related to the development of integrated circuits on gallium arsenide or equivalent binary or ternary elements of the III–V group, and with the development of normally-off or normally-on field-effect transistors. The circuits of normally -off transistors are very advantageous for several reasons:

They require only one supply voltage $V_{DD}$, and the ground,

They consume very little power, from 20 to 100 μW per gate,

Their speed/power product $P \cdot t_{pd}$ (power × propagation time) is smaller than for normally-on transistor circuits, They have high integrating density.

The disadvantage of logic gates with normally-off transistors is that the manufacturing technology is governed by severe constraints so that industrial output levels are not high.

The logic circuit known as the DCFL (direct coupled FET logic) circuit is therefore very advantageous because of its characteristics and its simplicity: it has only one stage, comprising one (or two) normally-off transistors or enhancement mode transistors powered by an active load working as the current source. In the current art, the active load can be made with a normally-on transistor or with a depleted mode transistor. The enhanced/depleted mode DCFL circuit is similar to the NMOS logic circuit grown on silicon.

However, variations in implantation results during manufacturing give two types of active loads:

Charges for which the current delivered is smaller than its rated value. However, in this case, acts can be taken to increase the current, Charges for which the current delivered is greater than its rated value. It is then necessary to find a way to reduce this current, to adjust it.

SUMMARY OF THE INVENTION

An active load is a transistor in which the gate metallization is short-circuited with the source metallization: if this charge is normally - on, it has a negative threshold voltage channel under its gate metallization. According to the invention, the current delivered by a current source is reduced and adjusted by means of at least one second gate metallization beneath which the channel has a positive threshold voltage: it partially blocks the passage of current in the charge.

The first gate, with a negative threshold voltage, and the second gate, with a positive threshold voltage work together so that the current blocked by the second gate adjusts the excess current, which would be let through by the first gate in the absence of the second gate, to its rated value.

More precisely, the invention pertains to an active load type of current source working together with at least one "normally-off" type of field effect transistor with a positive threshold voltage, this current source itself having the structure of a field effect transistor, the drain of which is powered by a positive voltage ($+V_{DD}$) and the gate metallization of which is connected to the source metallization, the invention comprising a first negative threshold voltage gate ($V_T<0$), controlling the passage of electrical charges from the source towards the drain along the whole width of the device, and at least one second gate with a positive threshold voltage ($V_T>0$), which is in contact with the first gate, the second gate serving to adjust the current given by the active load.

BRIEF DESCRIPTION OF THE DRAWINGS

The invention will be better understood from the example of n embodiment made with reference to the appended figures, of which:

FIG. 1 is an electrical diagram of a logic gate of the DCFL type according to the prior art;

FIG. 2 is a cross-section view of the active load according to the invention,

FIG. 3 is a plane view of the active load according to the invention during an intermediate stage in its manufacture, FIG. 4 is a plane view of the active load according to the invention in its completed stage.

DESCRIPTION OF THE PREFERRED EMBODIMENT

The invention will be better understood with a brief preliminary reminder of the structure of a DCFL type of logic gate and its method of manufacture. Although the invention also applies to circuits other than logic gates, its main advantages pertain to a DCFL gate on which the present description of the invention will be based.

An elementary logic gate DCFL is shown in FIG. 1. It comprises at least one input transistor 1, of the normally-off type, which is powered by an active load 2, comprising a current source. This active load 2 is simply a field effect transistor with its gate connected to the source. In certain cases, other input transistors such as 3 are parallel mounted on the first input transistor 1. This gate is powered by a single voltage $+V_{DD}$ on the drain of the current source 2, and the input transistor source is grounded. The output signal is taken at the common point between the drain of the input transistor 1 and the source of the transistor 2: in the case of the figure, if A and B are two input signals, the output signal is $\overline{A+B}$.

It has recently been discovered that combined enhancement/depletion mode gates have more advantageous characteristics than purely enhancement mode gates. In other words, a combined gate comprises:

One enhancement mode input transistor 1 of the normally-off type with a positive threshold voltage $V_T$, One depletion mode active load 2 of the normally-on type with a negative threshold voltage $V_T$.

The manufacture of these integrated circuits on Ga As therefore requires the manufacture of transistors with $V_T>0$ and transistors with $V_T<0$, according to the following manufacturing programme:

1/ On a substrate of semi-insulating GaAs, the implantation or epitaxy growth of $Si^{28}$ to make the active layers of the transistors, 2/ Depositing of source and drain ohmic contacts, 3/ Implantation of boron to make the insulating pads, 4/ Making of active loads with $V_T<0$.

5/ Making of transistors with $V_T>0$.

6/ Depositing of dielectrical bridges if there are intersections of interconnections, depositing of interconnection metallizations and depositing of the passivating layer.

These operations are quite conventional, but it is known by experience that variations in the characteristics of the active layers obtained by the implantation of $Si^{28}$ occur above all on the surface. It follows that the $V_T>0$ transistors working in the deep layers have relatively stable characteristics while the active loads with $V_T<0$, working in the surface layers have currents that fluctuate greatly with the implantation of $Si^{28}$.

But it has also been observed that the results of an implant of $Si^{28}$ are homogeneous for a wafer of semiconductive material, so that for a wafer all (or almost all) the currents in the charges are uniformly either smaller than or greater than the rated current: the adjusting of the charge current can therefore be a collective operation for the wafer.

By controlling the threshold voltage in an active load, it is possible to adjust the current upwards. If the current in a charge is smaller than its rated value, it can be adjusted by means of an additional implant of $Si^{28}$. But if the current in a charge is greater than its rated value, a reduction means is needed to adjust it.

Since the current in the active loads of a wafer can be controlled only after the fourth stage in the manufacturing method referred to above, the reduction can only take place at the fifth stage.

According to the invention, if an active load lets through an excessive current, this current is diminished and adjusted by depositing at least one second gate with a positive threshold voltage near the negative threshold voltage gate of the current charge, the said second gate with a positive threshold voltage limiting the width on which the current passes between the source and the drain. This second gate is deposited at the same time as the gate of the input transistor with a positive threshold voltage.

FIG. 2 shows a cross-section view of an active load according to the invention: to be properly understood, this figure must be viewed in conjunction with FIG. 4. FIG. 2 is a cross-section along the axis XX' of the FIG. 4.

In an active load, a semi-insulating substrate 4 supports an implanted or epitaxially grown conductive layer 5, limited at its surface by a pad 6 which has been rendered insulant. Two ohmic metallizations 7 and 8 act as source and drain electrodes and a metallization 9, connected to the source, acts as the gate. It is the usual practice to define the length of the gate along an axis such as XX' from the source towards the drain, and the width $Z_1$ of the gate along an axis parallel to the source and drain metallizations.

This active load is depleted, i.e. it has a threshold voltage of $V_T<0$. Since the said charge has been found to be excessively conductive by measurements in the course of manufacturing (stage 4), the invention provides for reducing the current which flows through it by adding at least a second gate electrode 10, which is an enhancement mode electrode and has a positive threshold voltage $V_T>0$. In fact, it is preferable to add two fractions of a second electrode 10. This provides for the more efficient controlling of the width $Z_2$ of the gate in which the first gate 9 with the negative threshold voltage remains active.

Owing to the uncertainty of the positioning of the second mask (used to make the second gate 10) with respect to the first mask (used to make the first gate 9) the two gates 9 and 10 are either superimposed, or overlap each other (as in FIGS. 2 and 4) or else side by side, but they are always in mutual electrical contact. Thus, the second gate 10 is in electrical contact with the source 7, through the first gate 9. The second gate 10 is therefore grounded through the input transistor 1 when this transistor is conductive. Thus, the current no longer flows under the second gate 10 since its threshold voltage $V_T$ is positive. The action of the first gate 9 is limited to the zone with the width $Z_2$.

FIG. 3 depicts an active load according to the invention during an intermediate stage of its manufacture.

In a wafer 4 of semi-insulating GaAs, an active layer 5 has been created by implanting $Si^{28}$. This active layer 5 will serve both as the input transistor 1 and the active load 2 (stage 1). The ohmic contact metallizations 7 and 8 (as well as those of the input transistor 1) are deposited on the active layer 5 (stage 2), and the insulating pads 6 which demarcate the active load 2 and the input transistor 1 are created in the wafer by the implantation of boron (stage 3). The surface of the wafer is then masked by the mask which uncovers only that part of the future first gate 9 which is actually on the active layer 5: a proton bombardment using known means can be used to determine the crystalline lattice in the region where it is sought to have a negative threshold voltage $V_T<0$ throughout the width $Z_1$ of the gate. Then, the gate metallization 9 is deposited (stage 4) by the lift-off method.

According to the invention, the wafers in the course of the manufacturing are then measured for charge current and sorted out. For those wafers that have an excessive charge current, the operator chooses, from among several masks, the one which will make it possible to deposit a second gate electrode 10 which reduces the current in the charge by a suitable value: for example 10%, or 25% or any other value.

The mask, or more exactly the set of masks used in the stage 5, therefore has the special feature of defining both the second gate 10 of the active load 2 and the input transistor gate 1: both are at positive threshold voltages and are manufactured simultaneously by another proton bombardment which creates positive threshold voltage regions under the future gate metallizations: in FIG. 4, it is the regions of the active layer 5 inside the openings of the second gate 10, which are thus transformed into positive threshold voltage regions. After this bombardment, the metallizations of the second gate 10 of the active load 2 and the gate of the input transistor 1 are deposited (stage 5).

The remaining operations are conventional ones and consist of the stages made necessary by the complex nature of the integrated circuit. These operations are the:

depositing of dielectrical bridges for the intersections of the interconnections, the depositing of metallic tracks of interconnections and pins for external links.

the depositing of a passivating layer.

The active loads according to the invention have several advantages:

The currents in the charges can be adjusted by the choice of the mask to make the positive threshold voltage gate 10, All the DCFL logic gates, which have a complex integrated circuit, have the same charge currents, The linearity of the currents: the gates of the transistors and the active loads have the same sub-micronic fineness, and the distances $Z_2$ between two fractions of the second gate 10 can be precise to the nearest micron. It is therefore possible to make active loads each of which has a specific length $Z_2$, so that it is possible to obtain multiple currents from a current with a low-value reference. This fact is suitable to linear circuits such as analog-digital converters or digital-analog converters.

The invention can therefore be used to make highly complex and very high-speed integrated circuits with, at the same time, high production efficiency since wafers for which a charge current is found to be excessive are recovered by adjusting the charge current.

Although the invention has been described using the example of a DCFL type logic gate on GaAs, it is clear that it pertains to all negative threshold voltage transistors for which it is sought to adjust the current that flows through them by adding a positive threshold voltage gate, whatever may be the semi-conductive material; silicon or materials such as InP or GaAlAs, etc. Of course the known operating conditions for implantation and bombardment are adapted to the material considered.

What is claimed is:

1. An active load current source, working in association with at least one "normally off" field effect transistor with a positive threshold voltage, this current source itself having the structure of a field effect transistor including a source and drain separated by a channel having a length, the source and drain having a channel width perpendicular to the channel length, said drain supplied with a positive voltage ($+V_{DD}$), said current source comprising a first negative threshold voltage gate ($V_T<0$) connected to said source and controlling the passage of electrical charges from the source towards the drain along the whole channel width of the current source, and at least one second gate with a positive threshold voltage ($V_T>0$), which is in contact with the first gate along a portion of the channel width, the second gate serving to block current and thereby to limit current flow from the source to the drain to that portion of the first gate not contacted by the second gate.

2. A current source as defined in the claim 1, wherein the two gates are parallel to each other and each are formed by a respective metallization and wherein the metallization of the second gate at least partially covers the metallization of the first gate to ensure electrical contact between them.

3. A current source as defined in the claim 1, comprising two sections of a second gate wherein the current that flows through it is adjusted by the choice of the distance between the two sections of the second gate.

* * * * *